(12) United States Patent
Tan et al.

(10) Patent No.: US 11,926,039 B2
(45) Date of Patent: Mar. 12, 2024

(54) ROBOT

(71) Applicants: KAWASAKI JUKOGYO KABUSHIKI KAISHA, Kobe (JP); Kawasaki Robotics (USA), INC., Wixom, MI (US)

(72) Inventors: Haruhiko Tan, Kobe (JP); Hajime Nakahara, San Jose, CA (US); Avish Ashok Bharwani, Santa Clara, CA (US); Ming Zeng, San Jose, CA (US)

(73) Assignees: KAWASAKI JUKOGYO KABUSHIKI KAISHA, Kobe (JP); KAWASAKI ROBOTICS (USA), INC., Wixom, MI (US)

( * ) Notice: Subject to any disclaimer, the term of this patent is extended or adjusted under 35 U.S.C. 154(b) by 611 days.

(21) Appl. No.: 17/134,221

(22) Filed: Dec. 25, 2020

(65) Prior Publication Data
US 2022/0203555 A1 Jun. 30, 2022

(51) Int. Cl.
*B25J 15/00* (2006.01)
*B25J 9/04* (2006.01)

(52) U.S. Cl.
CPC ............ *B25J 15/0014* (2013.01); *B25J 9/042* (2013.01)

(58) Field of Classification Search
CPC .... B25J 15/0014; B25J 9/042; B25J 11/0095; H01L 21/67742; H01L 21/67766; H01L 21/6838; H01L 21/68707
See application file for complete search history.

(56) References Cited

U.S. PATENT DOCUMENTS

| | | | | |
|---|---|---|---|---|
| 8,276,959 | B2 * | 10/2012 | Kim | B25J 15/10 294/902 |
| 8,382,180 | B2 * | 2/2013 | Kanawade | H01L 21/67742 294/902 |
| 8,720,965 | B2 * | 5/2014 | Hino | H01L 21/68707 414/744.8 |
| 10,109,515 | B2 * | 10/2018 | Kanazawa | B25J 15/0014 |
| 2008/0099970 | A1 * | 5/2008 | Kushida | H01L 21/67259 269/287 |
| 2014/0110959 | A1 * | 4/2014 | Urabe | H01L 21/68707 901/31 |
| 2020/0258768 | A1 | 8/2020 | Tomita et al. | |
| 2020/0258786 | A1 | 8/2020 | Tomita et al. | |

FOREIGN PATENT DOCUMENTS

| | | |
|---|---|---|
| CN | 110870057 A | 3/2020 |
| JP | H09-148404 A | 6/1997 |
| JP | 2003-266359 A | 9/2003 |
| JP | 2004-148476 A | 5/2004 |
| JP | 2019-021725 A | 2/2019 |

* cited by examiner

*Primary Examiner* — Stephen A Vu
(74) *Attorney, Agent, or Firm* — METROLEX IP LAW GROUP, PLLC

(57) ABSTRACT

A robot according to one or more embodiments may include an arm and a hand. The hand is connected to the arm and supports to convey a wafer. The hand includes a base end portion that is an end of the side connected to an arm, and a distal end portion that is an end of the opposite side of the base end portion. With the hand, a lightened part is formed in at least a part of a first region which is a region of a distal end portion than the center part in the longitudinal direction of the hand.

10 Claims, 5 Drawing Sheets

ROBOT

TECHNICAL FIELD

The present invention relates to a robot for conveying a wafer.

BACKGROUND ART

Conventionally, a robot has been used to convey a semiconductor wafer for example. PTL 1 discloses this type of robot (transport device).

The transport device of PTL 1 (PTL 1: WO2003/266359) includes a movable arm and an end effector for retaining a wafer. A damping means is provided to the distal end of the effector. The damping means is composed of, for example, a housing, a post disposed in a housing, a spring passed through a post, and a weight passed through a post. PTL 1 describes that the damping means is provided to change a natural frequency.

SUMMARY OF INVENTION

Technical Problem

In the transport device of PTL 1, while a damping means is provided at the distal end of an end effector, and thus a moment of inertia of the end effector will be increased. As a result, the controllability of the motion of a hand will be reduced. Additionally, a configuration of the end effector becomes complicated by providing the damping means.

The present invention has been made in view of the circumstances described above, and a primary object of the present invention is to provide a robot which controls the amplitude of the hand by a simple configuration while controlling the reduction in the controllability of the motion of the hand.

Solution to Problem

Problems to be solved by the present invention are as described above. Solutions to the problems and advantageous effects thereof will now be described.

A first aspect of the present invention provides a robot configuration for conveying a wafer as follows. That is, the robot includes an arm and a hand. The hand is connected to the arm and supports to convey the wafer. The hand includes a base end portion that is an end portion of the side connected to the arm, and a distal end portion that is an end portion of the opposite side of the base end portion. In the hand, a lightened part is formed in at least a part of a first region that is a region of the distal end portion than the center in a longitudinal direction of the hand.

This allows, the hand becomes lighter because of the lightened part is formed, so that the natural frequency of the hand becomes higher. As a result, the amplitude level of the hand can be suppressed. In addition, the weight of the hand (particularly the weight of the distal end portion) becomes lighter as compared with the configuration on which the weight is mounted to the hand. Therefore, the moment of inertia of the hand becomes smaller, so that the motion of the hand can be controlled more accurately. In addition, the structure of the hand can be simplified as compared with the configuration on which the weight is mounted to the hand.

Effect of the Invention

According to the present invention, a robot can be suppressed an amplitude of a hand by a simple configuration while suppressing the deterioration of control performance of the motion of the hand.

DESCRIPTION OF EMBODIMENTS

Figure 1:
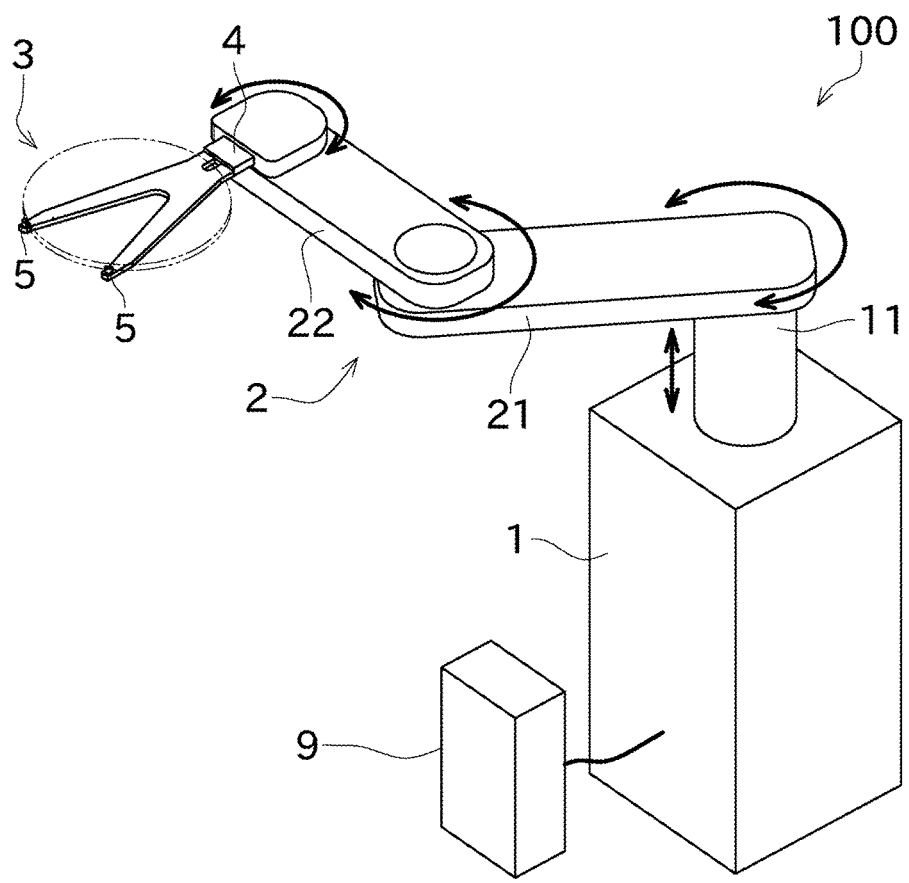
FIG. 1 is a perspective view showing an overall configuration of a robot according to an embodiment of the present invention.

Next, an embodiment of the present invention will now be described with reference to the drawings. FIG. 1 is a perspective view showing an overall configuration of a robot 100 according to an embodiment of the present invention.

The robot 100 shown in FIG. 1, for example, is disposed in a manufacturing factory of a wafer W such as a semiconductor wafer. The robot 100 is used to convey the wafer W between a plurality of positions. The wafer W may be any of a raw material of a wafer, the semi-finished product during machining, and the processed finished product. The shape of the wafer W is a disk-shape in the present embodiment, however, without being limited to this.

The robot 100 is a wafer conveyance robot. More specifically, the robot 100 is a vacuum robot for using in a space enclosed with respect to the external environment.

This robot 100 mainly includes a base 1, an arm 2, a hand 3, and a controller 9.

The base 1 is fixed to, for example, the floor surface of a factory. However, without being limited to this, for example, the base 1 may be fixed to an appropriate processing plant.

As shown in FIG. 1, the arm 2 is mounted to the base 1 via a lifting shaft 11 that can move in the vertical direction. The arm 2 can be rotated relative to the lifting shaft 11.

The arm 2 is a horizontal articulated-type arm. The arm 2 includes a first arm 21 and a second arm 22.

The first arm 21 is an elongated member extending in a linear shape arranged in horizontal. One end of the longitudinal direction of the first arm 21 is mounted to the upper end part of the lifting shaft 11. The first arm 21 is rotatably supported with the axis (vertical axis) of the lifting shaft 11 as the center. The second arm 22 is mounted to the other end of the longitudinal direction of the first arm 21.

The second arm 22 is an elongated member extending in a linear shape arranged in horizontal. One end of the longitudinal direction of the second arm 22 is mounted to the distal end of the first arm 21. The second arm 22 is rotatably supported with the axis (vertical axis) parallel to the lifting shaft 11 as the center. The hand 3 is mounted to the other end of the longitudinal direction of the second arm 22.

Each of the lifting shaft 11, the first arm 21, and the second arm 22 is driven by an appropriate actuator (not shown). This actuator is, for example, an electric motor.

In an arm joint unit located between the lifting shaft 11 and the first arm 21, between the first arm 21 and the second arm 22, and between the second arm 22 and the hand 3, an encoder (not shown) that detects each rotational position of the first arm 21, the second arm 22, and the hand 3 are mounted. In addition, at an appropriate position of the robot 100, an encoder that detects a change in position of the first arm 21 in the height direction (that is, the lifting quantity of the lifting shaft 11) is also provided.

The controller 9 controls the operation of the electric motor that drives each of the lifting shaft 11, the first arm 21, the second arm 22, and the hand 3. The control of these electric motors is performed based on the position information having the rotation position or the height position of the first arm 21, the second arm 22, or the hand 3 detected by each encoder.

The hand 3 is connected to the second arm 22 via a wrist unit 4. The wrist unit 4 is mounted to the distal end of the second arm 22. The wrist unit 4 is rotatably supported with the axis (vertical axis) parallel to the lifting shaft 11 as the center. The wrist unit 4 is rotationally driven by an appropriate actuator (not shown). This actuator is, for example, an electric motor. The hand 3 is connected to the wrist unit 4.

The hand 3 is an edge grip-type hand having a branching structure. At each distal end portion branched on the hand 3, an edge guide 5 is provided. A press member (not shown) is provided in the neighborhood of the wrist unit 4. The press member can be slide along the surface of the hand 3 by an actuator (not shown) (e.g., pneumatic cylinder). By sliding the press member with the wafer W placed on the hand 3, the wafer W can be held between the edge guide 5 and the press member in such a manner as to sandwich it.

The hand 3 is not limited to the edge grip-type. The hand 3 may be a passive grip-type or an adsorption-type. The passive grip-type is a configuration in which a wafer placed on the hand is not fixed (configuration not having a press member). The adsorption-type is a configuration (e.g., Bernoulli chuck) that the surface of the wafer W is sucked and conveyed with a negative pressure. In either configuration, the hand conveys a wafer by supporting a wafer.

Next, the hand 3 will be described in detail. The hand 3 is a thin plate-type member. The thickness of the hand 3 is, for example, between 0.5 mm to 5 mm. The material of the hand 3 may be a metal (e.g., aluminum or titanium), a resin, or an inorganic sintered compact (e.g., ceramic). The hand 3 is manufactured, for example, by machining a plate-type member. Still, instead of this manufacturing method, the hand 3 may be manufactured by using a mold, or the hand 3 may be manufactured by using a 3D printer.

Figure 2:
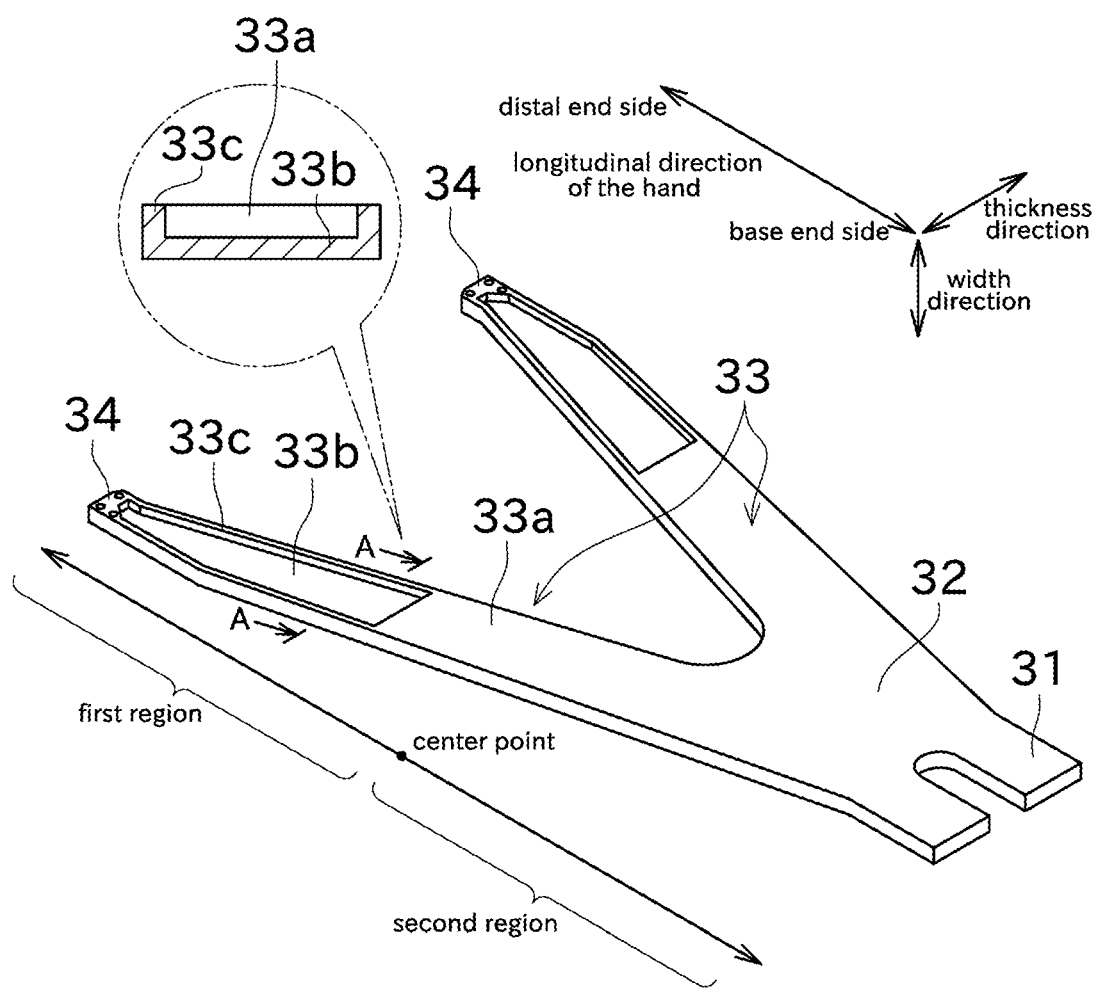
FIG. 2 is a perspective view showing the shape of a lower face of a hand.

FIG. 2 shows a perspective view of the hand 3. In the following description, the longitudinal direction of the hand 3 will be referred to as the "longitudinal direction of the hand". Along the longitudinal direction of the hand, the side connected to the arm 2 (wrist unit 4) is referred to as the "base end side", and the opposite side is referred to as the "distal end side". With the hand 3 having a thin plate-type, the thickness direction can be specified. The direction is referred to as the "width direction", the direction is perpendicular to the longitudinal direction of the hand, and is perpendicular to the thickness direction. The upper side face of the hand 3 in the vertical direction is referred to as an "upper face", and the lower side face in the vertical direction is referred to as a "lower face".

As described above, the hand 3 is connected to the arm 2 via the wrist unit 4. The hand 3 is a cantilever because it is supported on the side of the arm 2 by only on the end portion of the base end side. Consequently, during operating the hand 3, a vibration is likely to be occurred in the hand 3. Particularly, when the natural frequency of the hand 3 is low, the amplitude of the hand 3 tends to be made large. In the present embodiment, the natural frequency of the hand 3 will be increased by forming a lightened part on the hand 3. As a result, the amplitude of the hand 3 can be suppressed. This will be specifically described below.

FIG. 2 is a perspective view showing the shape of the lower face of the hand 3. The hand 3 includes a base end portion 31, a body portion 32, two branch portions 33, and a distal end portion 34. The base end portion 31 is an end portion on the base end side of the hand 3. The base end portion 31 includes not only a base end but also the neighborhood thereof. The base end portion 31 is connected to the arm 2 via the wrist unit 4. The body portion 32 is a part which is on the distal end side than the base end portion 31, and is on the base end side farther from the branch point. The branch portion 33 is located on distal end side than the branch portion. The two branch portions 33 are arranged in separating in the width direction. The two branch portions 33 are V-shaped type. That is, an interval in a width direction of two branch portions 33 is make longer as approaching the distal end side. In addition, the shape of the branch portion 33 is not limited to the shape of the present embodiment. The distal end portion 34 is an end portion on the base end side of the hand 3. The distal end portion 34 includes not only a distal end but also the neighborhood thereof.

In the present embodiment, a lightened part is formed on the branch portion 33. The lightened part is a part whose thickness is reduced by removing a part of the material of the hand 3 by machining for example (reduced remaining parts), or a part preformed using a mold or a 3D printer so as to have such a shape. In other words, it is a same shape part as hand 3 in a plan view, a constant thickness (to be specific, the same length as the thickest part of the hand 3), and the remaining removed parts corresponds to the lightened part as compared with a solid virtual hand which a hole or a notch are not formed. The purpose of forming the lightened part is to reduce the weight of the hand 3 and increase the natural frequency as compared with the virtual hand described above. Therefore, a minute part to which a weight of the hand 3 will not change does not correspond to the lightened part. For example, a part where the surface of the hand 3 is polished or a part where a screw holes and the like for mounting a component is formed does not correspond to the lightened part.

In the present embodiment, the region on distal end side than the center point of the longitudinal direction of the hand (the point that evenly divides the length into two) let be the first region, and the region on the base end side than the center point let be the second region. In the present embodiment, the distal end side of the branch portion 33 corresponds to the first region than the predetermined position of the branch portion 33. In order to increase the natural frequency sufficiently, it is preferable to form a lightened part on the distal end side of the hand 3. And thus, in the present embodiment, a lightened part is formed in the first region. In the present embodiment, since the lightened part is not formed in the second region, a lightened part may be formed in the second region in addition to the first region.

In the present embodiment, the lightened part is formed by forming a groove having a constant depth on the hand 3. Subsequently, the branch portion 33 having a thick part 33a and a thin part 33*b*. The thickness of the thin part 33*b* is smaller than the thickness of the thick part 33*a* (the first thickness). Because of the thin part 33*b* having the remaining parts whose thickness is reduced as compared with the thick part 33*a*, the thin part 33*b* corresponds to the lightened part. In the present embodiment, a plate-type member is removed so as to leave the edge part 33*c* in a width direction end of the branch portion 33. By leaving the edge part 33*c*, the rigidity of the branch portion 33 can be increased as compared with the configuration for removing the edge part 33*c*.

In addition, in the present embodiment, the lightened part is formed on the lower face of the branch portion 33. Therefore, a step as the boundary between the thick part 33*a* and the thin part 33*b* is located on the lower face of the branch portion 33. By forming the lightened part on the lower face, a dust is hardly accumulated on the lightened part. In addition, in the present embodiment, since the configuration is to place the wafer W on the upper face of the hand 3, a lightened part is formed on the surface of the side of the hand 3 that does not contact with the wafer W.

In order to sufficiently reduce the weight of the hand 3, it is preferable that the thickness of the thin part 33*b* is, for example, 60% or less of the thickness of the thick part 33*a*. Furthermore, in order to secure rigidity of the branch portion 33, it is preferable that the thickness of the thin part 33*b* is, for example, 30% or more of the thickness of the thick part 33*a*.

As described above, the edge guide 5 is mounted to the upper face of the distal end portion 34 of the hand 3. In this result, a mounting hole for mounting the edge guide 5 is formed in the distal end portion 34. Considering this point, in the present embodiment, the lightened part is not formed on the distal end portion 34.

The lightened part of the present embodiment is an example, the position, the range, and the shape of the lightened part may be different from that of the present embodiment. For example, in the present embodiment, although the thickness of the thin part 33*b* is the same value as a whole, the thickness may be different depending on the position. In addition, although the shape having the edge part 33*c* in the present embodiment, the configuration not having the edge part 33*c* may be employed (configuration which the entire width direction is the thin part 33*b*). Additionally, in the present embodiment, although a lightened part is formed in the range other than the distal end portion 34, a lightened part may be formed in the range including the distal end portion 34. In the present embodiment, for one branch portion 33, although one continuous lightened part is formed, two or more lightened parts separated from each other may be formed. In the present embodiment, although the lightened part is formed on the lower face of the branch portion 33, in addition to or instead of it, a lightened part may be formed on the upper face of the branch portion 33. The position where the lightened part is formed is not limited to the branch portion 33. For example, in the case of the body portion 32 is a shape located in the first region of the hand 3, a lightened part may be formed on the body portion 32.

Figure 3:
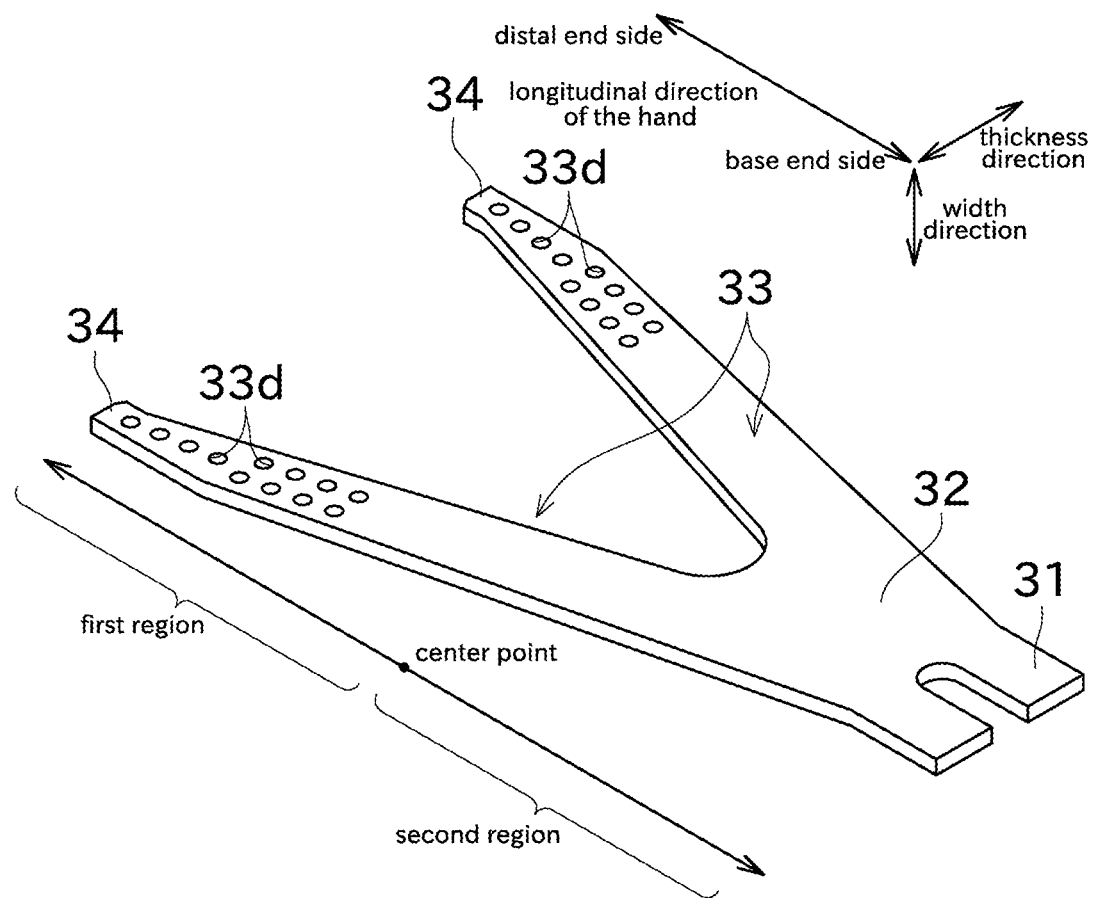
FIG. 3 is a perspective view showing the shape of a lower face of a hand according to the first modification.

Instead of the thin-shaped lightened part, as in the first modification shown in FIG. 3, one or several through holes 33*d* may be formed in the first region of the hand 3. The part where the through hole 33*d* is formed corresponds to the lightened part. The through hole 33*d* is formed in both two branch portions 33. Instead of the through hole, a non-through hole may be formed. The matters described with respect to the embodiment described above shall also be applied to the first modification and the second modification described below.

Figure 4:
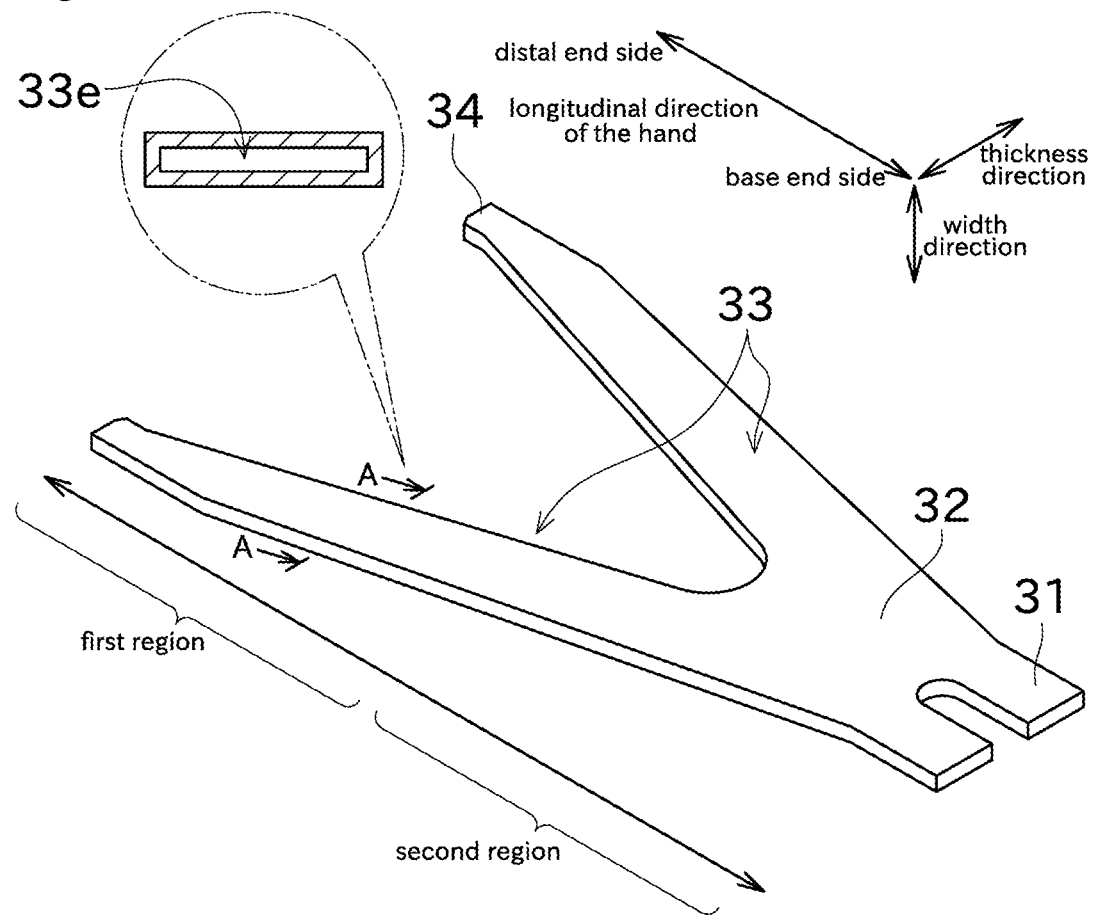
FIG. 4 is a perspective view showing the shape of a lower face of a hand according to the second modification.

In addition, as in the second modification shown in FIG. 4, a hollow portion 33*e* may be formed in the first region of the hand 3. The hollow portion 33*e* is a portion where the branch portion 33 is formed into hollow. The portion where the hollow portion 33*e* is formed corresponds to the lightened part. The hollow portion 33*e* is formed in both two branch portions 33. The hand 3 having the hollow portion 33*e* is manufactured by using a 3D printer for example.

Next, with reference to FIG. 5, the natural frequency of the hand 3 becomes higher by forming the lightened part, and the range suitable for forming the lightened part will be described.

By forming the lightened part on the hand 3, the load (gravity) applied to the hand 3 becomes smaller, so that the natural frequency becomes generally higher. Nonetheless, with reducing the rigidity by forming the lightened part, the amount of hanging of the distal end portion 34 of the hand 3 by its own weight becomes higher, so that the natural frequency may be lowered. And thus, when the range in which the lightened part is formed becoming too wide, the natural frequency may be rather lowered. That is, it is preferable to form a lightened part in an appropriate range in consideration of the both effects.

Figure 5:
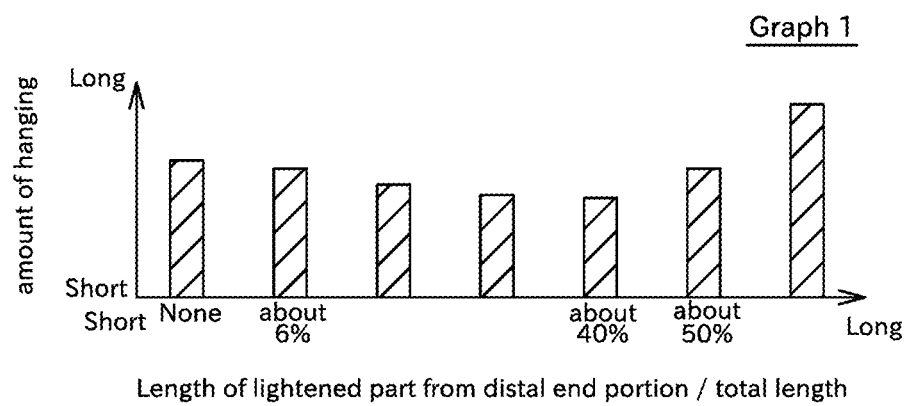
FIG. 5 is a Graph 1 and a Graph 2 showing the influence of a range in which the lightened part is formed.
Figure 5:
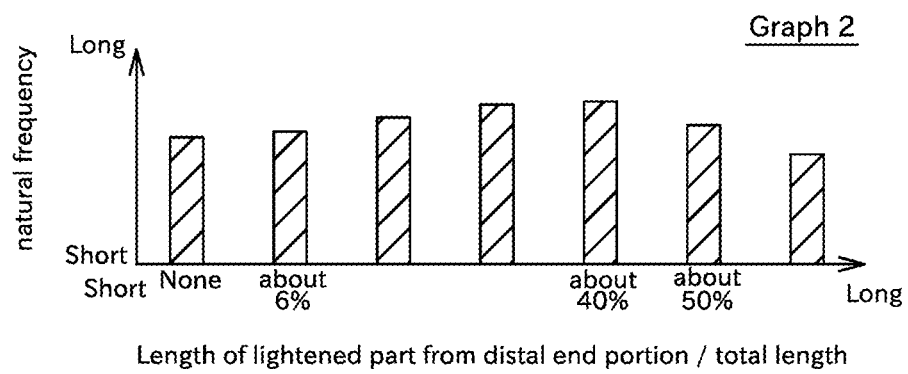

In the Graph 1 of FIG. 5, the vertical line indicates the amount of hanging by its own weight, and the horizontal axis indicates the range in which the lightened part is formed. The range in which the lightened part is formed is a value obtained by dividing the "length of the continuous lightened part from the distal end portion 34 (or the neighborhood thereof)" by the "total length" in the longitudinal direction of the hand. That is, in the case of the value on the horizontal axis is about 50%, a lightened part is formed from the distal end portion 34 (or the neighborhood thereof) to the center point in the longitudinal direction of the hand 3. As shown in Graph 1, when the range in which the lightened part is formed exceeds about 40%, the amount of hanging by its own weight becomes longer.

In the Graph 2 of FIG. 5, the vertical line indicates the natural frequency of the hand 3, and the horizontal axis indicates the range in which the lightened part is formed as in Graph 1. As shown in Graph 2, in the range in which the lightened part is formed up to about 40%, the natural frequency becomes higher as a range in which the lightened part is formed becomes higher. On the other hand, in the range in which the lightened part is formed more than about 50%, the natural frequency becomes lower even if the range in which the lightened part is formed becomes longer.

Considering the above results, when the lightened part is continuously formed from the distal end portion 34 (or the neighborhood thereof), the range may preferably be 50% or less for example. Furthermore, to provide the effect of increasing the natural frequency, the range may preferably be 6% or more for example.

However, the natural frequency differs depending on the shape, density, and Young's modulus of the hand 3, and further the shape of the lightened part (for instance, groove shape or through hole, and groove depth and through hole diameter). In this result, the knowledge obtained from Graphs 1 and 2 in FIG. 5 are values for reference only. That is, even if the range in which the lightened part is formed exceeds 50%, it does not deviate from the range of the present invention.

By forming a lightened part so that the natural frequency of the hand 3 becomes higher, the amplitude of the hand 3 can be suppressed. Further, by forming the lightened part, a space is formed on the hand 3. For example, a part such as sensors may be mounted by using this space.

When mounting a vibration control device is mounted to the distal end of the hand as in PTL 1, the natural frequency can be changed. However, since when the hand becomes heavy, the controllability of the motion of a hand will be reduced. On the other hand, in the present embodiment, the hand 3 becomes lighter, rather, the controllability of the motion of the hand will be improved. Furthermore, the vibration control device of PTL 1 is a part made of a material different from that of the hand. For this reason, it is necessary to confirm whether the vibration control device adversely effects to the deterioration of cleanliness in a clean room, and taking corrective actions when it has adversely affected. On the other hand, since the hand 3 of the present embodiment is only lightened from a material conventionally used, the cleanliness of the clean room is not adversely affected.

As described above, the robot 100 of the present embodiment includes an arm 2 and a hand 3. The hand 3 is connected to the arm 2 and supports to conveys the wafer W. The hand 3 includes the base end portion 31 which is an end portion on the side connected to the arm 2, and the distal end portion 34 which is an end portion on the opposite side of the base end portion 31. On the hand 3, a lightened part is formed in at least a part of a first region which is a region of a distal end portion than the center part in the longitudinal direction of the hand.

As a result, the hand 3 becomes lighter by forming the lightened part, the natural frequency of the hand 3 becomes higher. This enables, the vibration of the hand 3 can be suppressed. Furthermore, as compared with the configuration on which the weight is mounted to the hand 3, the motion of the hand 3 can be controlled more accurately, and the structure of the hand 3 can be simplified.

In addition, along the robot 100 of the present embodiment, the first region includes the thick part 33a which corresponds with a thickness matching the first thickness, and the thin part 33b as a lightened part which a thickness smaller than the first thickness.

Thereby, the effect of the present invention can be exhibited with a simple shape.

Also, along robot 100 of the first modification, the lightened part is a part where the through hole 33d is formed in the first region.

This makes it possible to suppress the vibration of the hand by performing simple processing. Especially, although the processing for forming the through hole 33d has a high degree of freedom in position, it is also possible to form the through hole 33d by selecting a position where a strength or wafer holding and the like is hard to occur.

In addition, along the robot 100 of the second modification, the lightened part is a part where the hollow portion 33e is formed in the first region.

This makes it difficult for dust and the like to collect on the lightened part.

Further, along the robot 100 of the present embodiment, a lightened part is formed in at least a part of the first region other than the distal end portion 34.

As a result, another component (e.g., the edge guide 5) can be mounted to the distal end portion 34. Alternatively, when the distal end portion 34 collides with something object, the distal end portion can be prevented from chipping.

Moreover, along the robot 100 of the present embodiment, for the hand 3, when the upper face in the vertical direction is the upper side face and the lower side face in the vertical direction is the lower face, the upper face is flat, and a step is formed as a boundary of the thick part 33a and the thin part 33b on the lower face.

This makes it difficult for dust and the like to collect on the upper face.

While a preferred embodiment and variations of the present invention and Embodying Mode has been described above, the above configurations may be modified, for example, as follows.

Instead of the configuration in which the base 1 is disposed on the floor surface of a factory, the configuration in which the base 1 is disposed on the ceiling face (ceiling-type) may be employed.

On the distal end portion 34 of the hand 3, instead of or in addition, to the edge guide 5 a mapping sensor for detecting the wafer W may be disposed.

The invention claimed is:

1. A robot for conveying a wafer comprising:
   an arm; and
   a hand which connects to the arm and supports to convey the wafer, wherein
   the hand includes a base end portion which is an end of a side connected to the arm and a distal end portion which is an end of an opposite side of the base end portion,
   a lightened part is formed in at least a part of a first region in the hand that is a region from a center in a longitudinal direction of the hand to the distal end portion, and
   the lightened part is formed so as to increase a natural frequency of the arm.

2. The robot according to claim 1, wherein
   the first region includes a thick part whose thickness is a first thickness and a thin part whose thickness is smaller than the first thickness, and
   the lightened part is the thin part.

3. The aligner apparatus according to claim 2, wherein
   the lightened part is formed in at least a part of the first region other than the distal end portion.

4. The aligner apparatus according to claim 2, wherein
   when an upper side face of the hand in a vertical direction is referred to as an upper face and a lower side face of the hand in a vertical direction is referred to as a lower face, the upper face is flat and a step is formed as a boundary of the thick part and the thin part on the lower face.

5. The robot according to claim 2, wherein
   the thin part is formed such that the thickness of the thin part is 60% or less of the first thickness.

6. The robot according to claim 5, wherein
   the thickness of the thin part is 30% or more of the first thickness.

7. The robot according to claim 1, wherein
   the lightened part is a part where a through hole is formed in the first region.

8. The aligner apparatus according to claim 1, wherein
   the lightened part is a portion which is formed into hollow in the first region.

9. The robot according to claim 1, wherein
   the lightened part is formed on a lower face of the hand in the first region.

10. The robot according to claim 9, wherein the lower face of the hand comprises a surface of a side of the hand that does not contact the wafer.

* * * * *